(12) United States Patent
Zou

(10) Patent No.: US 6,300,845 B1
(45) Date of Patent: Oct. 9, 2001

(54) LOW-VOLTAGE, CURRENT-FOLDED SIGNAL MODULATORS AND METHODS

(75) Inventor: Min Z. Zou, San Jose, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 09/544,837

(22) Filed: Apr. 6, 2000

(51) Int. Cl.[7] ................................ H04B 1/28; H03C 1/36
(52) U.S. Cl. ...................... 332/178; 323/315; 330/288; 455/333
(58) Field of Search ........................ 332/178; 323/315; 327/116, 119–121; 330/288; 455/313, 322, 323, 326, 333

(56) References Cited

U.S. PATENT DOCUMENTS

| 4,156,283 | * | 5/1979 | Gilbert ................................ 364/841 |
| 5,594,633 | * | 1/1997 | Asazawa ................................ 363/73 |
| 5,872,446 | * | 2/1999 | Cranford, Jr. et al. ............... 323/315 |
| 5,877,974 | * | 3/1999 | Can ....................................... 364/841 |
| 5,920,810 | * | 7/1999 | Finol et al. ........................... 455/313 |

* cited by examiner

Primary Examiner—David Mis
(74) Attorney, Agent, or Firm—Fish & Neave; Robert W. Morris

(57) ABSTRACT

A low voltage, current-folded signal modulator that reduces distortion in the output signal is provided. The signal modulator has a differential amplifier that receives a first input signal and converts it to a current, a current amplifier that has a low impedance input and provides an amplified current signal, and a differential pair circuit that receives a second input signal and modulates the amplified current signal by the second signal.

50 Claims, 5 Drawing Sheets

US 6,300,845 B1

LOW-VOLTAGE, CURRENT-FOLDED SIGNAL MODULATORS AND METHODS

BACKGROUND OF THE INVENTION

The present invention relates to apparatus and methods for signal modulation. More specifically, this invention relates to apparatus and methods for low-voltage, current-folded signal modulator circuits.

A signal modulator circuit multiplies a first signal by a second signal, and may be used to shift the frequency components of the first signal from one frequency band to another frequency band. For example, a signal modulator circuit may be used to modulate a low frequency baseband signal (the first signal) by a high frequency carrier signal (the second signal), such as modulating a telephone signal that has frequency components from approximately 300–3400 Hz onto a higher frequency carrier signal (e.g. a 2 MHZ carrier signal). A modulator also may be used to shift a low frequency voice signal to a high frequency radio carrier signal for transmission over long distances. Modulating a signal onto a higher frequency carrier signal is called up-conversion. A signal modulator also may be used to down-convert a signal to lower frequencies.

One previously known signal modulator circuit 10, commonly called a Gilbert-cell mixer, is shown in schematic diagram form in FIG. 1. Gilbert-cell mixer 10 includes transconductance amplifier 12 and cross-coupled differential pair 14. Gilbert-cell mixer 10 receives differential first signal ($V_{IN}^+ - V_{IN}^-$) and second signal ($V_{LO}^+ - V_{LO}^-$), and provides differential output signal ($V_{OUT}^+ - V_{OUT}^-$). First signal ($V_{IN}^+ - V_{IN}^-$) may be a baseband signal, and second signal ($V_{LO}^+ - V_{LO}^-$) may be a high frequency modulation signal generated by a local oscillator. Output signal ($V_{OUT}^+ - V_{OUT}^-$) is the modulated output.

Transconductance amplifier 12 includes current source 11, emitter resistors 13A and 13B, and transistors 15 and 16. Cross-coupled differential pair 14 includes differential pair transistors 17 and 18, differential pair transistors 19 and 20, and resistors 21 and 22. Differential pair transistors 17 and 18 are cross coupled with differential pair transistors 19 and 20.

Transistor 15 has a collector coupled to emitters of transistors 17 and 18, a base coupled to input $V_{IN}^+$, and an emitter coupled to a first terminal of resistor 13A. Transistor 16 has a collector coupled to emitters of transistors 19 and 20, a base coupled to input $V_{IN}^-$, and an emitter coupled to a first terminal resistor 13B. The second terminals of resistors 13A and 13B are coupled to GROUND through current source 11. Transistor 17 has a base coupled to input $V_{LO}^+$ and a collector coupled to supply voltage $V_{CC}$ through resistor 21. Transistor 18 has a base coupled to input $V_{LO}^-$, and a collector coupled to supply voltage $V_{CC}$ through resistor 22. Transistor 19 has a base coupled to input $V_{LO}^-$, and a collector coupled to supply voltage $V_{CC}$ through resistor 21. Transistor 20 has a base coupled to input $V_{LO}^+$, and a collector coupled to supply voltage $V_{CC}$ through resistor 22. Modulated output signals $V_{OUT}^+$ and $V_{OUT}^-$ are provided at the collectors of transistors 17 and 20, respectively. Transconductance amplifier 12 converts differential first signal ($V_{IN}^+ - V_{IN}^-$) into differential current signal $I_X = (I_X^+ - I_X^-)$. Cross-coupled differential pair circuit 14 modulates differential current signal ($I_X^+ - I_X^-$) by second signal ($V_{LO}^+ - V_{LO}^-$) to produce differential output signal ($V_{OUT}^+ - V_{OUT}^-$).

For many applications (e.g. battery powered cellular telephones), it is desirable to implement a signal modulator that consumes as little power as possible, thereby minimizing its energy needs. The power consumption of a signal modulator circuit is proportional to the supply voltage used to power the circuit. Thus, using a lower supply voltage advantageously reduces the power consumption of the circuit. There are, however, inherent constraints in the Gilbert-cell mixer that set a lower limit on the supply voltage for the circuit.

For example, in circuit 10, supply voltage $V_{CC}$ may be expressed as:

$$V_{CC} = V_{R-21} + V_{CE-17} + V_{CE-15} + V_{R-13A} + V_{I-11} \quad (1)$$

where $V_{R-21}$ is the voltage drop across resistor 21, $V_{CE-17}$ is collector-emitter voltage of transistor 17, $V_{CE-15}$ is the collector-emitter voltage of transistor 15, $V_{R-13A}$ is the voltage drop across resistor 13A, and $V_{I-11}$ is the voltage drop across current source 11. Transistors 17 and 15 enter saturation when their collector-emitter voltage drops below $V_{CE-SAT}$ (e.g., 0.4 volts). If $V_{IN}^+$ has a DC voltage of 1.4 volts and a voltage swing of ±0.25 (i.e., $V_{IN}^+$ has a maximum value of 1.65 volts and a minimum value of 1.15 volts), $V_{CE-15}$ should be greater than $V_{CE-SAT}$ plus the voltage swing of $V_{IN}^+$. Therefore, $V_{CE-15}$ is at least 0.65 volts to prevent transistor 15 from entering saturation and causing distortion in $V_{OUT}$. If $V_{LO}^+$ has a voltage swing of 200 mV, then $V_{CE-17}$ should be at least 0.60 volts (i.e., $V_{CE-SAT} + 200$ mV) to prevent transistor 17 from entering saturation. $V_{R-21}$ may be, for example, 0.5 volts; $V_{I-11}$ is typically 0.4–0.6 volts; and $V_{R-13A}$ equals the voltage swing in $V_{IN}^+$ (e.g., 0.25 volts). For these exemplary signal values, $V_{CC}$ must be at least 2.4–2.6 volts.

If a lower supply voltage is used, output signals $V_{OUT}^+$ and $V_{OUT}^-$ may not have sufficient room to reach their peak amplitude. Also, a low supply voltage may cause transistors in circuit 10 to saturate, resulting in a non-linear output response that causes distortion in output signal ($V_{OUT}^+ - V_{OUT}^-$). With a low supply voltage, transistors in circuit 10 saturate for large values of $V_{IN}^+$ and $V_{IN}^-$. Thus, lowering the supply voltage results in a trade-off: the more that the supply voltage is lowered to save power, the more distortion may be present in the output signal. Therefore, the peak amplitude of $V_{IN}^+$ and $V_{IN}^-$ and maximum distortion requirements in output signals $V_{OUT}^+$ and $V_{OUT}^-$ are constraints that set a lower limit on the supply voltage of circuit 10.

It would, however, be desirable to provide signal modulator circuits that consume less power than previously known Gilbert-cell mixer circuits, such as circuit 10. In particular, it would be desirable to provide signal modulator circuits that consume low power by operating at a low supply voltage.

It also would be desirable to provide signal modulator circuits that produce an output signal with reduced distortion at low supply voltages.

It further would be desirable to provide signal modulator circuits that allow for greater input voltage swings at low supply voltages.

SUMMARY OF THE INVENTION

It is an object of the present invention to provide signal modulator circuits that consume low power by operating at a low supply voltage.

It also is an object of the present invention to provide signal modulator circuits that produce an output signal with reduced distortion at low supply voltages.

It further is an object of the present invention to provide signal modulator circuits that allow for a greater input voltage swings at low supply voltages.

These and other objects of the present invention are provided by signal modulator circuits that comprise a transconductance amplifier, a current amplifier, and a differential pair circuit. The transconductance amplifier converts a first voltage signal to a current signal. The current amplifier has a low input impedance and provides a current output signal. The differential pair circuit modulates the current output signal of the current amplifier by a second signal to produce a frequency-modulated output signal with minimal distortion. Modulator circuits of the present invention can operate at low supply voltages without compromising the integrity of the modulated signal.

Methods of the present invention include generating a current signal that varies with a first signal, amplifying the current signal, and modulating the amplified current signal by a second signal to produce a modulated output signal.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE PREFERRED EMBODIMENT

Figure 1:
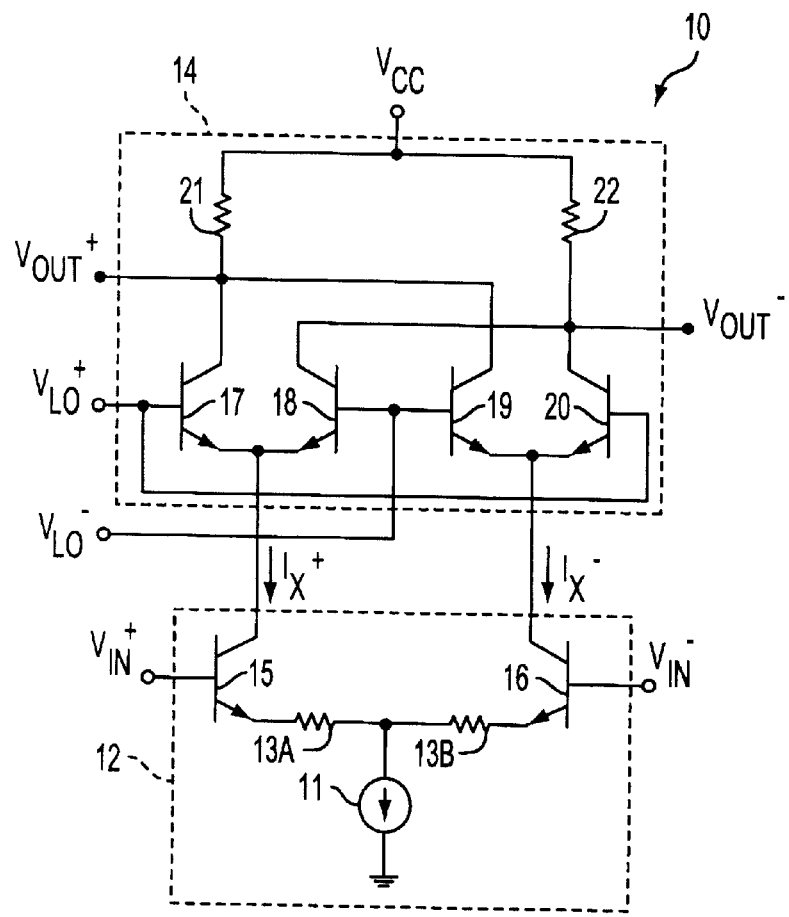
FIG. 1 is a block diagram of a prior art Gilbert-cell mixer signal modulator circuit.
Figure 2:
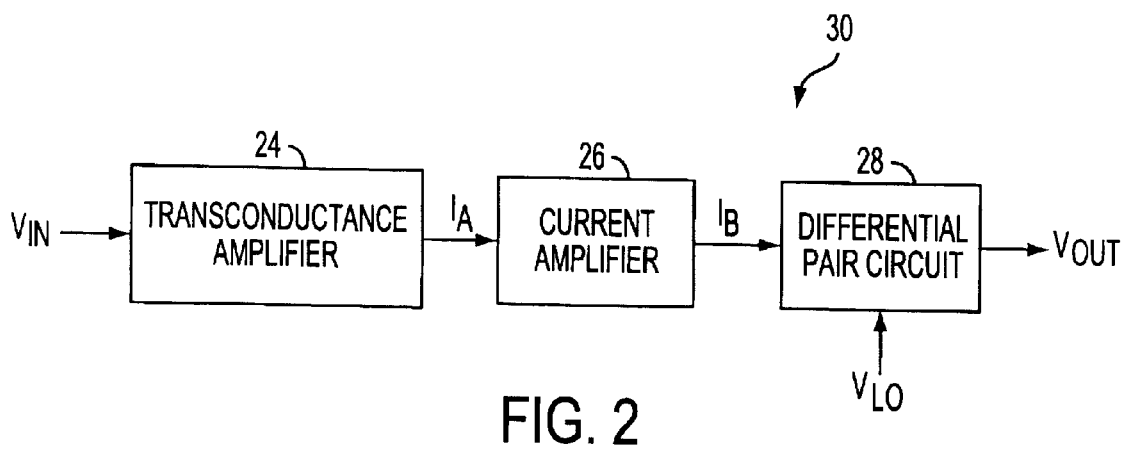
FIG. 2 is a block diagram of an illustrative embodiment of a signal modulator in accordance with the principles of the present invention.

The present invention improves upon the Gilbert-cell mixer of FIG. 1. Referring to FIG. 2, an illustrative embodiment of a signal modulator circuit in accordance with the principles of the present invention is described. Signal modulator circuit 30 includes transconductance amplifier 24, current amplifier 26, and differential pair circuit 28. Transconductance amplifier 24 converts a first signal $V_{IN}$ from a voltage signal to current signal $I_A$. Current amplifier 26 has low input impedance and amplifies current signal $I_A$ to provide signal $I_B$ to differential pair circuit 28. Differential pair circuit 28 modulates amplified current signal $I_B$ by a second signal $V_{LO}$ to produce a modulated output signal $V_{OUT}$. As described in more detail below, signal modulator 30 may operate at a low supply voltage because the supply voltage is applied across transconductance amplifier 24 in parallel with differential pair circuit 28 and current amplifier 26. Signal modulator 30 also produces modulated output signal $V_{OUT}$ with low distortion because current amplifier 26 has low input impedance.

Figure 3:
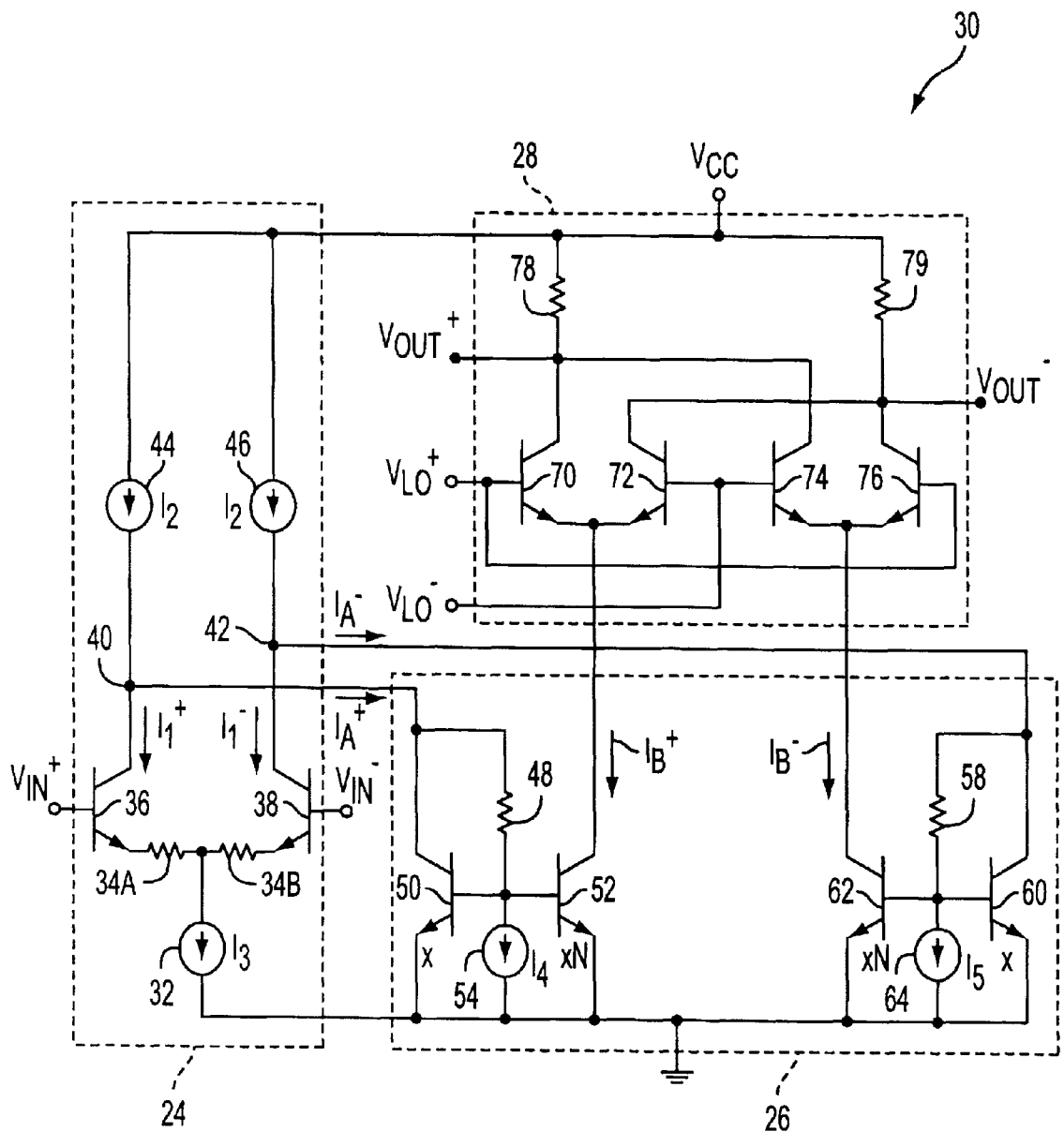
FIG. 3 is a schematic diagram of an illustrative embodiment of a signal modulator in accordance with the principles of the present invention.

Referring to FIG. 3, an illustrative schematic diagram of the circuit of FIG. 2 is described. Signal modulator circuit 30 receives differential first signal $V_{IN}=(V_{IN}^+-V_{IN}^-)$ and second signal $V_{LO}=(V_{LO}^+-V_{LO}^-)$, and provides differential output signal $V_{OUT}=(V_{OUT}^+-V_{OUT}^-)$. Signal $V_{IN}$ may be a low frequency baseband signal and signal $V_{LO}$ may be a high frequency carrier signal. Signals $V_{IN}$, $V_{LO}$, and $V_{OUT}$ may be time varying (i.e., alternating current) signals.

Signal modulator circuit 30 comprises transconductance amplifier 24, current amplifier 26 and differential pair circuit 28. Transconductance amplifier 24 receives differential first signal $V_{IN}=(V_{IN}^+-V_{IN}^-)$ and provides differential current $I_A=(I_A^+-I_A^-)$. Current amplifier 26 has low input impedance and receives current $I_A=(I_A^+-I_A^-)$ and provides amplified current $I_B=(I_B^+-I_B^-)$. Differential pair circuit 28 receives amplified current $I_B=(I_B^+-I_B^-)$, and second signal $V_{LO}=(V_{LO}^+-V_{LO}^-)$, and provides modulated output signal $V_{OUT}=(V_{OUT}^+-V_{OUT}^-)$.

Transconductance amplifier 24 includes transistors 36 and 38, current sources 32, 44, and 46, and emitter resistors 34A and 34B. Transistors 36 and 38 may be, for example, bipolar junction transistors (BJTs) as shown in FIG. 3. Alternatively, transistors 36 and 38 may be metal oxide field effect transistors (MOSFETs) or other suitable transistors. Transistor 36 has a collector coupled to positive supply $V_{CC}$ through current source 44, a base coupled to input $V_{IN}^+$, and an emitter coupled to a first terminal of emitter resistor 34A. Transistor 38 has a collector coupled to positive supply $V_{CC}$ through current source 46, a base coupled to input $V_{IN}^-$, and an emitter coupled to a first terminal of emitter resistor 34B. The second terminals of emitter resistors 34A and 34B are coupled to GROUND through current source 32.

Current sources 44 and 46 conduct substantially the same current $I_2$. Current source 32 conducts current $I_3$ which may be approximately equal to or less than current $I_2$ (e.g., $I_3 \approx 0.95 I_2$). Transconductance amplifier 24 converts differential first signal $V_{IN}=(V_{IN}^+-V_{IN}^-)$ to differential current $I_A=(I_A^+-I_A^-)$.

Current $I_A$ varies linearly with $V_{IN}$ as long as transistors 36 and 38 do not saturate. If transistors 36 or 38 saturate, current signal $I_A=(I_A^+-I_A^-)$ and output signal $V_{OUT}$ may become distorted. In the linear region of operation, the relationship between $I_A=(I_A^+-I_A^-)$ and $V_{IN}$ may be expressed as:

$$(I_A^+-I_A^-)=K_1(V_{IN}^+-V_{IN}^-) \qquad (2)$$

where $K_1$ is the amplification factor of transconductance amplifier 24. This relationship holds over a certain range of $V_{IN}$ based on the circuit parameters. For example, if $V_{IN}^+$ and $V_{IN}^-$ have a maximum value of 1.45 volts, $I_2=360\ \mu A$, $I_3=340\ \mu A$, $I_4=I_5=25\ \mu A$, resistors 34A and 34B=2 k$\Omega$ each, and resistors 48 and 58=18 k$\Omega$ each, then current $I_A$ varies linearly with $V_{IN}$ for $V_{IN}=(V_{IN}^+-V_{IN}^-) \leq 500$ mV peak-to-peak. The effect of the circuit parameters on the linear range of operation is discussed below.

Currents $I_1^+$ and $I_1^-$ are the collector currents of transistors 36 and 38, respectively. If $V_{IN}^+$ increases above $V_{IN}^-$, current $I_1^+$ increases by an amount +Q and current $I_1^-$ decreases by -Q. In response to the increase +Q in current $I_1^+$, current $I_A^+$ decreases by -Q because current $I_2$ conducted by current source 44 is constant. In response to the decrease -Q in current $I_1^-$, current $I_A^-$ increases by +Q because current $I_2$ conducted by current source 46 is constant.

On the other hand, if $V_{IN}^-$ increases above $V_{IN}^+$, current $I_1^-$ increases by an amount +Q and current $I_1^+$ decreases by -Q. In response to the decrease -Q in current $I_1^+$, current $I_A^+$ increases by +Q because current $I_2$ conducted by current source 44 is constant. In response to the increase +Q in current $I_1^-$, current $I_A^-$ decreases by -Q because current $I_2$ conducted by current source 46 is constant. The diversion of current from current sources 44 and 46 between transconductance amplifier 24 and current amplifier 26 as $V_{IN}$ varies is referred to as current-folding. Current $I_A=(I_A^+-I_A^-)$ is the current-folded signal.

Distortion may occur in transconductance amplifier 24 if transistor 36 saturates, or if transistor 38 saturates. Saturation may occur in transistor 36 if the collector-to-emitter voltage of transistor 36 drops below $V_{CE-SAT}$ of transistor 36 (e.g., 0.4 volts). Saturation may occur in transistor 38 if the collector-to-emitter voltage of transistor 38 drops below $V_{CE-SAT}$ of transistor 38 (e.g., 0.4 volts). Emitter resistors 34A and 34B introduce emitter degeneration into the differential amplifier to linearize the voltage-to-current transition, and help reduce distortion in signals $I_A^+$ and $I_A^-$ Emitter resistors 34A and 34B, however, are optional and may be omitted from circuit 30.

Current amplifier 26 has low input impedance and amplifies current signal $I_A=(I_A^+-I_A^-)$ to produce current signal $I_B=(I_B^+-I_B^-)$. Current amplifier 26 includes transistors 50, 52, 60, and 62, resistors 48 and 58, and current sources 54 and 64. Transistors 50, 52, 60 and 62, for example, may be BJTs as shown in FIG. 3. Alternatively, transistors 50, 52, 60, and 62 may be MOSFETs or other suitable transistors. As shown in FIG. 3, transistor 50 has a collector coupled to a collector of transistor 36, a base coupled to a first terminal of resistor 48 and a base of transistor 52, and an emitter coupled to GROUND. Resistor 48 has a second terminal coupled to a collector of transistor 50. Transistor 52 as a collector coupled to differential pair circuit 28, a base coupled to GROUND through current source 54, and an emitter coupled to GROUND. Transistor 60 has a collector coupled to a collector of transistor 38, a base coupled to a first terminal of resistor 58 and a base of transistor 62, and an emitter coupled to GROUND. Resistor 58 has a second terminal coupled to a collector of transistor 60. Transistor 62 has a collector coupled to differential pair circuit 28, a base coupled to GROUND through current source 64, and an emitter coupled to GROUND.

Current amplifier 26 has low input impedance and provides current gain. The low input impedance extends the linear operating range of transistors 36 and 38 so that larger input signals $V_{IN}^+$ and $V_{IN}^-$ do not cause transistors 36 and 38 to saturate. The impedances at nodes 40 and 42 are express as follows:

$$Z_{NODE40} = \frac{1}{g_m} + \frac{R_{48}}{1+\frac{\beta}{N+1}} \quad (N \ll \beta) \quad (3)$$

$$Z_{NODE42} = \frac{1}{g_m} + \frac{R_{58}}{1+\frac{\beta}{N+1}} \quad (N \ll \beta) \quad (4)$$

where $Z_{NODE40}$ and $Z_{NODE42}$ represent the impedance at nodes 40 and 42, respectively, $\beta$ is the current gain of each of transistors 50 and 60, $g_m$ is the transconductance of each of transistors 50 and 60, $R_{48}$ is the resistance of resistor 48, $R_{58}$ is the resistance of resistor 58, and N is the ratio of the base-emitter junction areas of transistors 52 to 50 and of transistors 62 to 60. If transistors 50, 52, 60, and 62 are MOSFETs, N is the gate width-to-length ratio of transistors 52 to 50 and of transistors 62 to 60.

As shown in equations (3) and (4), the current gain $\beta$ of transistors 50 and 60 is selected to be substantially larger than the value of N (e.g., $\beta \approx 100-200$, and N=3) so that the impedance at node 40 is less than $R_{48}$ plus $1/g_m$, and the impedance at node 42 is less than $R_{58}$ plus $1/g_m$. The values of resistors 48 and 58 and the current conducted by current sources 54 and 64 are selected so that the voltages at nodes 40 and 42 are always sufficiently high to prevent transistors 36 and 38 from saturating. In other words, the collector-emitter voltage of transistor 36 should be greater than $V_{CE-SAT}$ of transistor 36 to prevent saturation in transistor 36, and the collector-emitter voltage of transistor 38 should be greater than $V_{CE-SAT}$ of transistor 38 to prevent saturation in transistor 38. For example, the resistance of resistors 48 and 58 may be about 18 k$\Omega$, $I_2$ may be 360 $\mu$A, $I_3$ may be 340 $\mu$A, and $I_4$ and $I_5$ may be about 25 $\mu$A to avoid saturation in transistors 36 and 38 where $V_{CE-SAT}$=0.2 volts.

Transistor 50 and resistor 48 comprise a negative feedback loop circuit that reduces the impedance at node 40. The small-signal impedance at node 40 may be expressed as:

$$r_{40} = \frac{\Delta v_{40}}{\Delta i_{40}} \quad (5)$$

where $\Delta v_{40}$ is the small signal change in voltage at node 40, and $\Delta i_{40}$ is the small signal change in current flowing into node 40. Change in current $\Delta i_{40}$ produces a corresponding change $\Delta v_{40}$. Indeed, if the current flowing into node 40 increases, the current through resistor 48 increases, causing the base currents of transistors 50 and 52 to increase. As a result, the collector current of transistor 50 increases, slowing the increase in the voltage at node 40. On the other hand, if current flowing into node 40 decreases, the current through resistor 48 decreases, causing the base currents of transistors 50 and 52 to decrease. As a result, the collector current of transistor 50 decreases, slowing the decrease in the voltage at node 40. The negative feedback loop that comprises transistor 50 and resistor 48 therefore limits impedance $Z_{NODE40}$ (as shown in equation 3) and the peak-to-peak amplitude of the voltage swing at node 40.

Transistor 60 and resistor 58 similarly comprise a negative feedback loop circuit that reduces the impedance at node 42. If the current flowing into node 40 increases, the current through resistor 58 increases, causing the base currents of transistors 60 and 62 to increase. As a result, the collector current of transistor 60 increases, slowing the increase in the voltage at node 42. On the other hand, if current flowing into node 42 decreases, the current through resistor 58 decreases causing the base currents of transistors 60 and 62 to decrease. As a result, the collector current of transistor 60 decreases, slowing the decrease in the voltage at node 42. The negative feedback loop that comprises transistor 60 and resistor 58, therefore limits impedance $Z_{NODE42}$ (as shown in equation 4) and the peak-to-peak amplitude of the voltage swing at node 42.

The low input impedance at nodes 40 and 42 limits the peak-to-peak amplitude of the voltage swing at these nodes for a given input voltage $V_{IN}$. For example, $V_{CC}$ may be on the order of about 2 volts and the voltage swing at nodes 40 and 42 may be about 50 mV, which is much less than $V_{CC}$. The low input impedance at nodes 40 and 42 allows $V_{IN}^+$ and $V_{IN}^-$ to be relatively large without saturating transistors 36 and 38, thereby keeping the voltage-to-current transition linear and preventing distortion in $V_{OUT}$. Also, the reduction in the voltage swing at nodes 40 and 42 allows circuit 30 to operate at a reduced supply voltage $V_{CC}$ without causing transistors 36 and 38 to saturate.

Current amplifier 26 also provides current amplification to drive differential pair circuit 28. In particular, transistors 50 and 52 form a current mirror that amplifies current $I_A^+$ to produce current $I_B^+$. The current conducted by resistor 48, which equals the sum of $I_4$ plus the base currents of transistors 50 and 52, is much less than current $I_A^+$. Accordingly, the collector current of transistor 50 approximately equals current $I_A^+$. Because the base-emitter junction area of transistor 52 is N times the base-emitter junction area of transistor 50, collector current $I_B^+$ of transistor 52 substantially equals N times the collector current of transistor 50:

$$I_B^+ \approx I_A^+ \times N \qquad (6)$$

N may be any suitable current amplification factor (e.g., N=3).

Similarly, the current conducted by resistor 58, which equals the sum of $I_5$ plus the base Currents of transistors 60 and 62, is much less than current $I_A^-$. Accordingly, the collector current of transistor 60 approximately equals current $I_A^-$. Transistors 60 and 62 form a current mirror that amplifies current $I_A^-$ to produce current $I_B^-$. Because the base-emitter junction area of transistor 62 is N times the base-emitter junction area of transistor 60, collector current $I_B^-$ of transistor 62 substantially equals N times the collector current of transistor 60.

$$I_B^- \approx I_A^- \times N \qquad (7)$$

Equations (6) and (7) show that the current-to-current amplification performed by current mirrors 50/52 and 60/62 has a linear gain. Thus, current amplifier 26 amplifies differential current $I_A = (I_A^+ - I_A^-)$ by a factor of N to produce differential current $I_B = (I_B^+ - I_B^-)$:

$$(I_B^+ - I_B^-) \approx N(I_A^+ - I_A^-) \approx K_1 N(V_{IN}^+ - V_{IN}^-) \qquad (8)$$

Differential pair circuit 28 multiplies current signal $I_B = (I_B^+ - I_B^-)$ by a second signal $V_{LO} = (V_{LO}^+ - V_{LO}^-)$ to provide a modulated output signal $V_{OUT} = (V_{OUT}^+ - V_{OUT}^-)$. Differential pair circuit 28 includes transistors 70, 72, 74, and 76, and resistors 78 and 79. Differential pair transistors 70 and 72 are cross-coupled with differential pair transistors 74 and 76. Transistors 70, 72, 74, and 76 may be, for example, BJTs as shown in FIG. 3. Alternatively, transistors 70, 72, 74, and 76 may be MOSFETs or other suitable transistors.

Transistor 70 has a collector coupled to positive supply $V_{CC}$ through resistor 78, a base coupled to second signal $V_{LO}^+$, and an emitter coupled to a collector of transistor 52. Transistor 72 has a collector coupled to positive supply $V_{CC}$ through resistor 79, a base coupled to second signal $V_{LO}^-$, and an emitter coupled to a collector of transistor 52. Transistor 74 has a collector coupled to positive supply $V_{CC}$ through resistor 78, a base coupled to second signal $V_{LO}^-$, and an emitter coupled to a collector of transistor 62. Transistor 76 has a collector coupled to positive supply $V_{CC}$ through resistor 79, a base coupled to second signal $V_{LO}^+$, and an emitter coupled to a collector of transistor 62. Modulated differential output signals $V_{OUT}^+$ and $V_{OUT}^-$ are provided at the collectors of transistors 70 and 76, respectively.

Figure 4A:
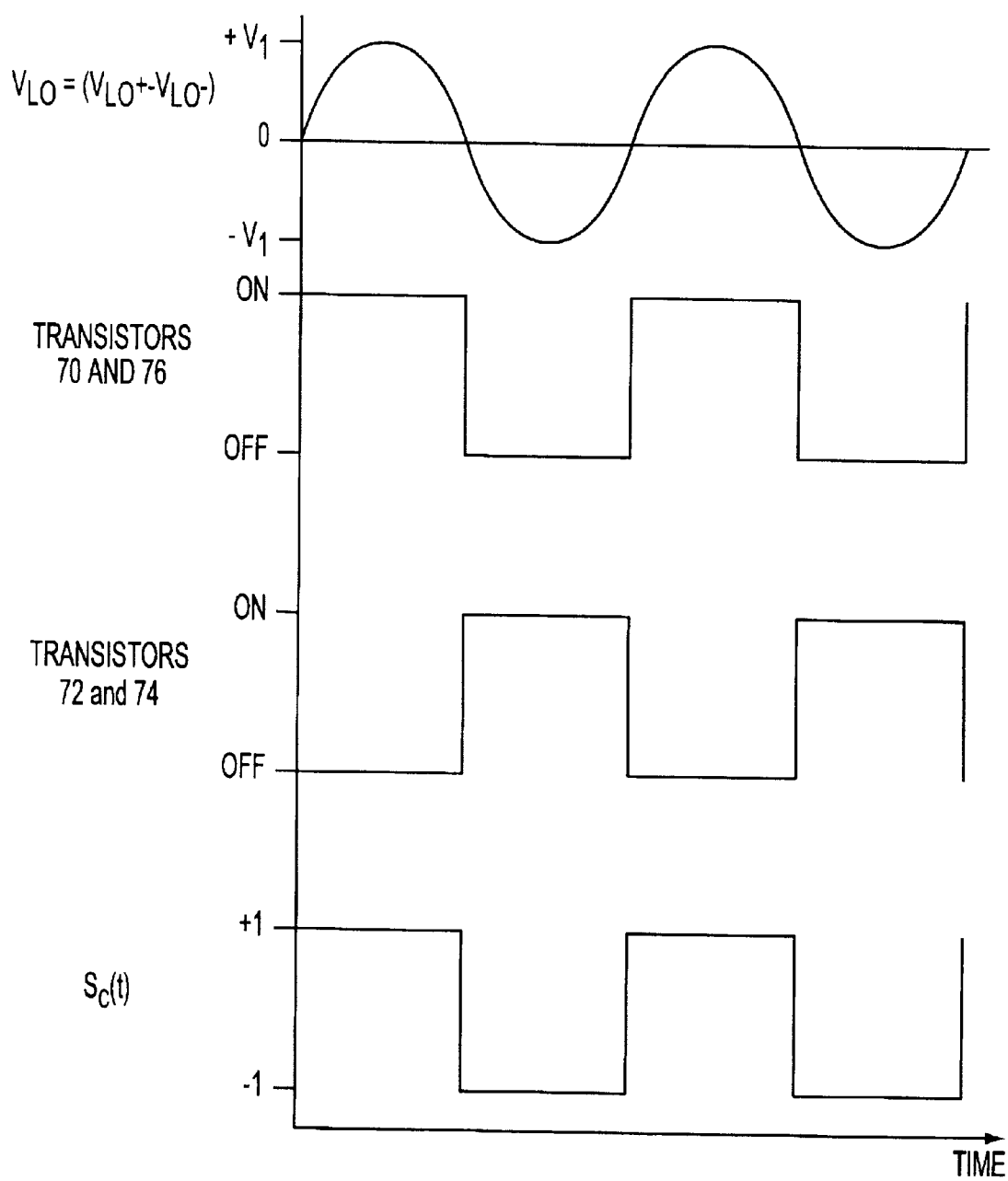
FIGS. 4A and 4B are diagrams of illustrative waveforms of the signal modulator of FIG. 3.

Second signal $V_{LO} = (V_{LO}^+ - V_{LO}^-)$ controls transistors 70, 72, 74, and 76 to generate modulated differential output signal $V_{OUT} = (V_{OUT}^+ - V_{OUT}^-)$ from current signal $I_B = (I_B^+ - I_B^-)$. If second signal $V_{LO} = (V_{LO}^+ - V_{LO}^-)$ is a high-level signal such that $|V_{LO}| >> V_T$ (where $V_T$ is the thermal voltage of transistors 70, 72, 74, and 76), then transistors 70, 72, 74, and 76 operate as synchronous switches (that is, are either fully ON or fully OFF). When transistors 70 and 76 are ON and conducting current, transistors 72 and 74 are OFF and conducting substantially no current. When transistors 72 and 74 are ON and conducting current, transistors 70 and 76 are OFF and conducting substantially no current. Thus, as shown in FIG. 4A, transistors 70 and 76 switch ON and OFF out of phase with transistors 72 and 74 in response to signal $V_{LO} = (V_{LO}^+ - V_{LO}^-)$, which varies between $+V_1$ and $-V_1$.

The relationship between differential current $I_B$ and differential output signal $V_{OUT}$ may be expressed as:

$$V_{OUT} = (V_{OUT}^+ - V_{OUT}^-) = K_3 (I_B^+ - I_B^-) S_C(t) \qquad (9)$$

where $K_3$ is a constant determined by the resistance of resistors 78 and 79, and $S_C(t)$ is a waveform that represents the switching state of transistors 70, 72, 74, and 76 for each cycle of $V_{LO}$. As shown in FIG. 4A, $S_C(t)$ equals +1 when transistors 70 and 76 are ON, and equals -1 for the other half of every cycle of $V_{LO}$ when transistors 72 and 74 are ON.

Figure 4B:
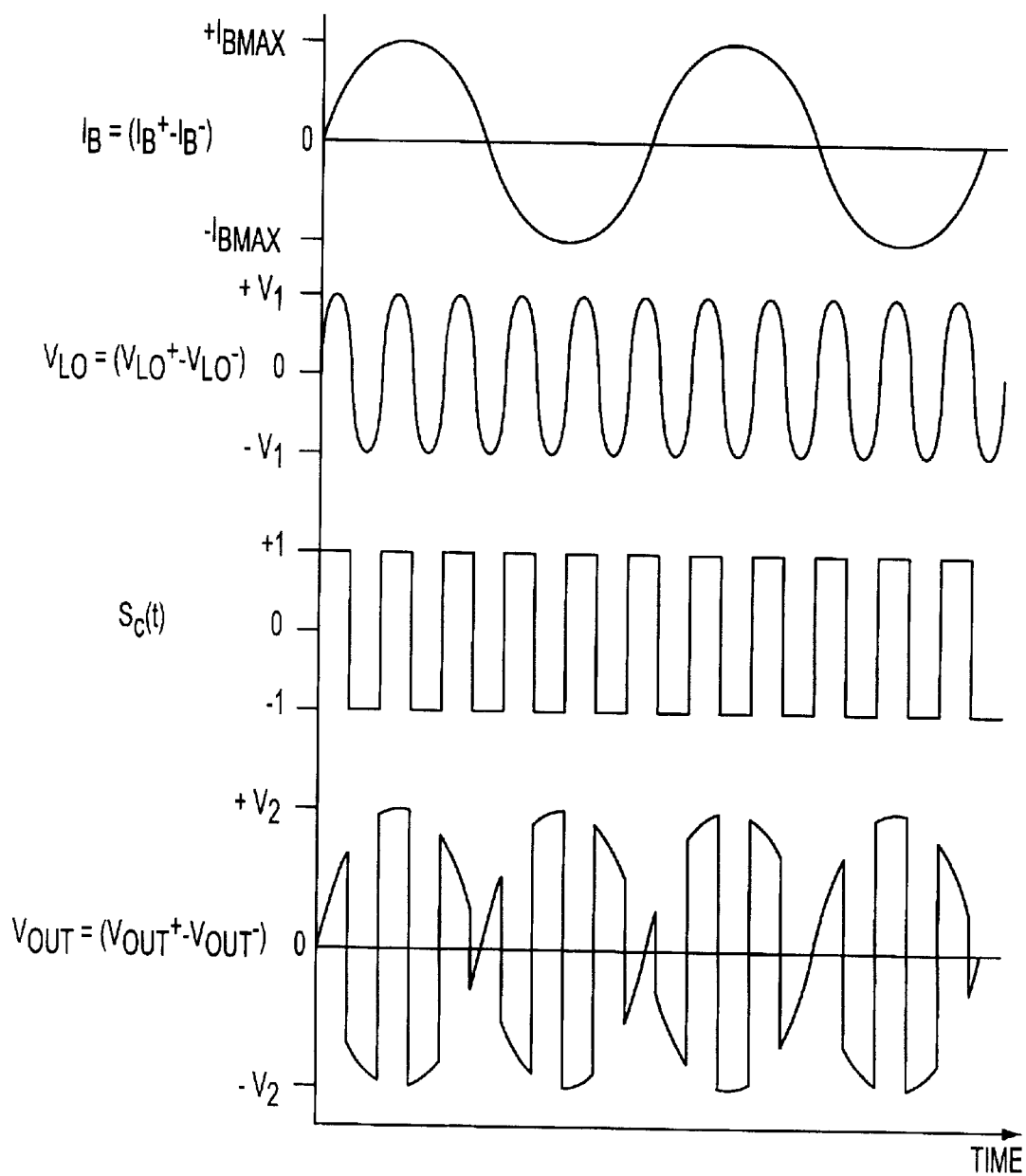

FIG. 4B illustrates exemplary waveforms $IB$, $V_{LO}$, $S_C(t)$, and $V_{OUT}$. In FIG. 4B, $I_B$ varies between $+I_{BMAX}$ and $-I_{BMAX}$, $V_{LO}$ varies between $+V_1$ and $-V_1$, and $V_{OUT}$ varies between $+V_2$ and $-V_2$. The amount of current output $I_B^+$ and $I_B^-$ needed to drive differential pair circuit 28 depends upon the amplitude of the output signals $V_{OUT}^+$ and $V_{OUT}^-$ and the resistance of resistors 78 and 79. Larger output signals $V_{OUT}^+$ and $V_{OUT}^-$ require larger current signals $I_B^+$ and $I_B^-$. Signal modulator 30 of FIG. 3 may be used to shift input signal $V_{IN}$ to a higher or a lower frequency.

The signal modulator circuit of FIG. 3 advantageously may operate at a low supply voltage because $V_{CC}$ is applied across transconductance amplifier 24 in parallel with differential pair circuit 28 and current amplifier 26, and because current amplifier 26 limits the voltage swing at nodes 40 and 42 as discussed above. Current amplifier 26 provides current directly to differential pair circuit 28 (instead of to a transconductance amplifier). The supply voltage $V_{CC}$ of circuit 30 may be reduced relative to circuit 10 because there is a lower voltage drop across transconductance amplifier 24 in parallel with differential pair circuit 28 and current amplifier 26 compared to the voltage drop across circuit 10 in which $V_{CC}$ drops across differential pair 14 in series with transconductance amplifier 12.

The lower limit on the supply voltage depends on the voltages of first signal $V_{IN}$, second signal $V_{LO}$, and output signal $V_{OUT}$, and the voltage drops across the circuit components. The minimum required voltage drop from $V_{CC}$ to ground across transconductance amplifier 24 typically is greater than the minimum required voltage drop across differential pair circuit 28 and current amplifier 26. Therefore, the voltage drops across the components in transconductance amplifier 24 determine the lower limit of supply voltage $V_{CC}$. Referring to FIG. 3, supply voltage $V_{CC}$ may be expressed as:

$$V_{CC} = V_{I-32} = V_{R-34A} + V_{CE-36} + V_{I-44} \qquad (10)$$

where $V_{I-44}$ is the voltage drop across current source 44, $V_{CE-36}$ is the collector-emitter voltage of transistor 36, $V_{R-34A}$ is the voltage across resistor 34A, and $V_{I-32}$ is the voltage drop across current source 32. $V_{I-44}$ and $V_{I-32}$ are typically in the range of 0.4–0.6 volts. $V_{IN}^+$ may, for example, have a DC voltage of 1.4 volts with a voltage swing of ±0.25 volts. $V_{CE-36}$ should be greater than $V_{CE-SAT}$ (e.g., 0.4 volts) plus the voltage swing of $V_{IN}^+$ to prevent saturation of transistor 36. $V_{CE-36}$ should, therefore, be at least 0.65 volts. $V_{R-34A}$ equals 0.25 volts (i.e., the voltage swing of $V_{IN}^+$). Therefore, using equation (10), $V_{CC}$ can be, for example, as low as between 1.7 and 2.1 volts without introducing distortion in $V_{OUT}$. Thus, signal modulators of the present invention can operate at a low supply voltage, and thereby save power.

Figure 5:
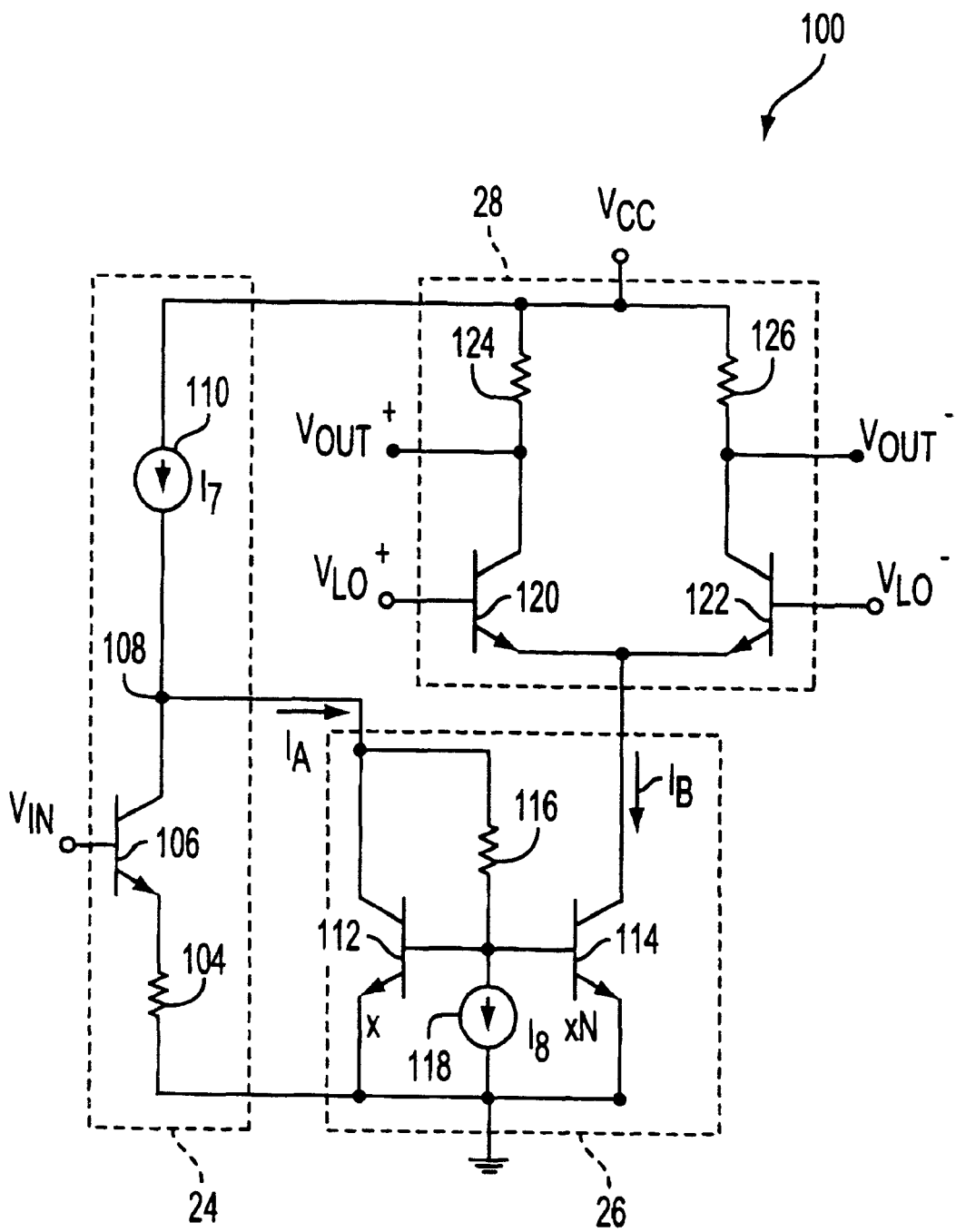
FIG. 5 is a schematic diagram of another illustrative embodiment of a signal modulator in accordance with the principles of the present invention.

Signal modulators in accordance with the principles of this invention alternatively may be used to modulate a single-ended first signal $V_{IN}$ by a differential second signal $V_{LO}$ ($V_{LO}=V_{LO}^+-V_{LO}^-$) to provide a differential output signal $V_{OUT}=(V_{OUT}^+-V_{OUT}^-)$ An alternative embodiment of signal modulators of the present invention with single-ended input $V_{IN}$ is shown in FIG. 5.

Signal modulator circuit 100 receives single-ended first signal $V_{IN}$ and differential second signal $V_{LO}=(V_{LO}^+-V_{LO}^-)$, and provides differential output signal $V_{OUT}=(V_{OUT}^+-V_{OUT}^-)$. Signal modulator circuit 100 comprises transconductance amplifier 24, current amplifier 26, and differential pair circuit 28. Transconductance amplifier 24 receives input voltage $V_{IN}$ and provides current $I_A$. Current amplifier 26 receives current $I_A$ and provides amplified current $I_B$. Differential pair circuit 28 receives amplified current $I_B$ and second signal ($V_{LO}^+-V_{LO}^-$), and provides modulated output signal ($V_{OUT}^+-V_{OUT}^-$).

Transconductance amplifier 24 in FIG. 5 includes transistor 106, current source 110, and resistor 104. Transistor 106 has a collector coupled to $V_{CC}$ through current source 110, a base coupled to $V_{IN}$, and an emitter coupled to GROUND through emitter resistor 104. Current amplifier 26 in FIG. 5 includes transistors 112 and 114, resistor 116, and current source 118. Transistor 112 has a collector coupled to a collector of transistor 106, a base coupled to a first terminal of resistor 116 and a base of transistor 114, and an emitter coupled to GROUND. Resistor 116 has a second terminal coupled to a collector of transistor 112. Transistor 114 has a collector coupled to differential pair circuit 28, a base coupled to GROUND through current source 118, and an emitter coupled to GROUND. Differential pair circuit 28 includes resistors 124 and 126, and transistors 120 and 122. Transistors 106, 112, 114, 120, and 122 may be, for example, BJTs as shown in FIG. 5. Alternatively, transistors 106, 112, 114, 120, and 122 may be MOSFETs or other suitable transistors.

Transconductance amplifier 24 converts first signal $V_{IN}$ to current $I_A$ Signals $I_A$ and $V_{OUT}$ may become distorted if transistor 106 saturates. Current amplifier 26 has a negative feedback loop (transistor 112 and resistor 116) that provides a low impedance input to transconductance amplifier 24 that limits the peak-to-peak amplitude of the voltage swing at node 108 as discussed above with respect to FIG. 3. The reduction in the peak-to-peak amplitude of the voltage swing at node 108 prevents transistor 106 from saturating for a given signal range of $V_{IN}$ thereby preventing distortion in signal $I_A$. Circuit 100 allows for a greater signal range of $V_{IN}$ without causing distortion in signals $I_A$ and $V_{OUT}$ for a given value of $V_{CC}$. Resistor 104 introduces emitter degeneration into transconductance amplifier 24 to further reduce distortion in $I_A$.

Current amplifier 26 includes a current mirror formed by transistors 112 and 114. The base-emitter junction area of transistor 112 is N times the base-emitter junction area of transistor 114. Current amplifier 26 amplifies current $I_A$ by a factor of N to produce current $I_B$ as discussed above with respect to FIG. 3.

Differential pair circuit 28 includes transistors 120 and 122 that switch ON and OFF out of phase with each other according to the value of $V_{LO}$ to modulate current signal $I_B$ with differential second signal $V_{LO}$ to produce differential output signal $V_{OUT}$ as shown in the following equation:

$$V_{OUT}=(V_{OUT}^+-V_{OUT}^-)=K_4\, I_B S_C(t) \tag{11}$$

where $K_4$ is a constant determined by the resistance of resistors 124 and 126, and $S_C(t)$ is a waveform that represents the switching state of switching transistors 120 and 122. $S_C(t)$ equals +1 when transistor 120 is ON, and −1 when transistor 122 is ON.

Circuit 100 operates at a low supply voltage because $V_{CC}$ is applied across transconductance amplifier 24 in parallel with differential pair circuit 28 and current amplifier 26, and because negative feedback loop 112 and 116 reduces the voltage swing at node 108. The supply voltage for circuit 100 may be expressed as:

$$V_{CC}=V_{I\text{-}110}+V_{CE\text{-}106}+V_{R\text{-}104} \tag{12}$$

where $V_{I\text{-}110}$ is the voltage drop across current source 110 which is typically 0.4–0.6 volts, and $V_{R\text{-}104}$ is the voltage drop across resistor 104 which equals the voltage swing of $V_{IN}$. $V_{CE\text{-}106}$ is the collector-emitter voltage drop of transistor 106 which must be greater than $V_{CE\text{-}SAT}$ (e.g., 0.4 volts) plus the voltage swing of $V_{IN}$ to prevent transistor 106 from saturating and causing $V_{OUT}$ to become distorted. Thus, for an input signal $V_{IN}$ with a voltage swing of ±0.25 volts, $V_{CC}$ may be between 1.3 and 1.5 volts without introducing distortion in $V_{OUT}$.

Persons skilled in the art further will recognize that the circuitry of the present invention may be implemented using circuit configurations other than those shown and discussed above. All such modifications are within the scope of the present invention, which is limited only by the claims which follow.

What is claimed is:

1. A circuit that generates an output signal at an output node proportional to a first signal at a first signal node modulated by a second signal at a second signal node, the circuit comprising:
   a transconductance amplifier circuit comprising an input terminal coupled to the first signal node;
   a current mirror circuit coupled to an output of the transconductance amplifier, the current mirror circuit comprising a feedback circuit; and
   a differential pair circuit comprising a first input terminal coupled to the second signal node, a second input terminal coupled to an output of the current mirror circuit, and an output terminal coupled to the output node.

2. The circuit of claim 1, wherein the current mirror circuit comprises a first transistor having first, second and third terminals, and a second transistor having first, second and third terminals.

3. The circuit of claim 2, wherein the first and second transistors are bipolar junction transistors, and the second transistor has a base-emitter junction area that is larger than a base-emitter junction area of the first transistor.

4. The circuit of claim 2, wherein the first and second transistors are metal oxide semiconductor field-effect transistors, and the second transistor has a gate width-to-length ratio that is larger than a gate width-to-length ratio of the first transistor.

5. The circuit of claim 2, wherein the first, second and third terminals of the first transistor comprise collector, base and emitter terminals, respectively, and the first, second and third terminals of the second transistor comprise collector, base and emitter terminals, respectively.

6. The circuit of claim 2, wherein the first, second and third terminals of the first transistor comprise drain, gate, and source terminals, respectively, and the first, second and third terminals of the second transistor comprise drain, gate, and source terminals, respectively.

7. The circuit of claim 2, wherein the feedback circuit comprises a resistor coupled from the first terminal of the first transistor to the second terminal of each of the first and second transistors, and the current mirror circuit further comprises a current source coupled from the second terminal of each of the first and second transistors to the third terminal of each of the first and second transistors.

8. The circuit defined in claim 2, wherein the current mirror circuit further comprises third and fourth transistors, each comprising first, second, and third terminals.

9. The circuit defined in claim 8, wherein first, second, third, and fourth transistors are bipolar junction transistors, the second transistor has a base-emitter junction area that is larger than a base-emitter junction area of the first transistor, and the fourth transistor has a base-emitter junction area that is larger than a base-emitter junction area of the third transistor.

10. The circuit defined in claim 8, wherein first, second, third, and fourth transistors are metal oxide semiconductor field-effect transistors, the second transistor has a gate width-to-length ratio that is larger than a gate width-to-length ratio of the first transistor, and the fourth transistor has a gate width-to-length ratio that is larger than a gate width-to-length ratio of the third transistor.

11. The circuit of claim 8, wherein the first, second and third terminals of each of the first, second, third, and fourth transistors comprise collector, base and emitter terminals, respectively.

12. The circuit of claim 8, wherein the first, second and third terminals of each of the first, second, third, and fourth transistors comprise drain, gate, and source terminals, respectively.

13. The circuit of claim 8, wherein the feedback circuit comprises first and second feedback circuits;
wherein the first feedback circuit comprises a first resistor coupled from the first terminal of the first transistor to the second terminal of each of the first and second transistors;
wherein the second feedback circuit comprises a second resistor coupled from the first terminal of the third transistor to the second terminal of each of the third and fourth transistors; and
wherein the current mirror circuit further comprises a first current source coupled from the second terminal of each of the first and second transistors to the third terminal of each of the first and second transistors, and a second current source coupled from the second terminal of each of the third and fourth transistors to the third terminal of each of the third and fourth transistors.

14. The circuit defined in claim 1 wherein the differential pair circuit further comprises:
first and second transistors each having first, second, and third terminals, wherein the output terminal, the first input terminal, and the second input terminal of the differential pair circuit comprise the first, second, and third terminals, respectively of each of the first and second transistors.

15. The circuit defined in claim 14 wherein the first and second transistors comprise bipolar junction transistors.

16. The circuit defined in claim 14 wherein the first and second transistors comprise metal oxide semiconductor field-effect transistors.

17. The circuit defined in claim 14 wherein the differential pair circuit further comprises:
a pair of second input terminals coupled to first and second outputs, respectively, of the current mirror circuit; and third and fourth transistors each having first, second, and third terminals, wherein the first terminal of the third transistor is coupled to the first terminal of the first transistor, the second terminal of the third transistor is coupled to the second terminal of the second transistor, the first terminal of the fourth transistor is coupled to the first terminal of the second transistor, the second terminal of the fourth transistor is coupled to the second terminal of the first transistor, the third terminals of each of the first and second transistors are coupled to the first output of the current mirror circuit, and the third terminals of each of the third and fourth transistors are coupled to the second output of the current mirror circuit.

18. The circuit defined in claim 17, wherein first, second, third, and fourth transistors are bipolar junction transistors.

19. The circuit defined in claim 17, wherein first, second, third, and fourth transistors are metal oxide semiconductor field-effect transistors.

20. A method for generating an output signal proportional to a first voltage signal modulated by a second signal, the method comprising:
converting the first voltage signal to a first current signal using a transconductance amplifier;
amplifying the first current signal to provide a second current signal using a current mirror circuit having a feedback circuit; and
multiplying the second current signal with the second signal using a differential pair circuit.

21. The method defined in claim 20, wherein converting the first voltage signal to the first current signal further comprises converting a differential first voltage signal to a differential first current signal using the transconductance amplifier with differential pair transistors.

22. The method defined in claim 20, wherein the current mirror circuit comprises a first transistor having first, second and third terminals, and a second transistor having first, second and third terminals.

23. The method of claim 22, wherein the first and second transistors are bipolar junction transistors, and the second transistor has a base-emitter junction area that is larger than a base-emitter junction area of the first transistor.

24. The method of claim 22, wherein the first and second transistors are metal oxide semiconductor field-effect transistors, and the second transistor has a gate width-to-length ratio that is larger than a gate width-to-length ratio of the first transistor.

25. The method of claim 22, wherein the first, second and third terminals of the first transistor comprise collector, base and emitter terminals, respectively, and the first, second and third terminals of the second transistor comprise collector, base and emitter terminals, respectively.

26. The method of claim 22, wherein the first, second and third terminals of the first transistor comprise drain, gate, and source terminals, respectively, and the first, second and third terminals of the second transistor comprise drain, gate, and source terminals, respectively.

27. The method of claim 22, wherein the feedback circuit comprises a resistor coupled from the first terminal of the first transistor to the second terminal of each of the first and second transistors, and the current mirror circuit further comprises a current source coupled from the second terminal of each of the first and second transistors to the third terminal of each of the first and second transistors.

28. The method defined in claim 22, wherein the current mirror circuit further comprises third and fourth transistors, each comprising first, second, and third terminals.

29. The method defined in claim 28, wherein first, second, third, and fourth transistors are bipolar junction transistors, the second transistor has a base-emitter junction area that is larger than a base-emitter junction area of the first transistor, and the fourth transistor has a base-emitter junction area that is larger than a base-emitter junction area of the third transistor.

30. The method defined in claim 28, wherein first, second, third, and fourth transistors are metal oxide semiconductor field-effect transistors, the second transistor has a gate width-to-length ratio that is larger than a gate width-to-length ratio of the first transistor, and the fourth transistor has a gate width-to-length ratio that is larger than a gate width-to-length ratio of the third transistor.

31. The method of claim 28, wherein the first, second, and third terminals of each of the first, second, third, and fourth transistors comprise collector, base and emitter terminals, respectively.

32. The method of claim 28, wherein the first, second and third terminals of each of the first, second, third, and fourth transistors comprise drain, gate, and source terminals, respectively.

33. The method of claim 28, wherein the feedback circuit comprises first and second feedback circuits;

wherein the first feedback circuit comprises a first resistor coupled from the first terminal of the first transistor to the second terminal of each of the first and second transistors;

wherein the second feedback circuit comprises a second resistor coupled from the first terminal of the third transistor to the second terminal of each of the third and fourth transistors; and wherein the current mirror circuit further comprises a first current source coupled from the second terminal of each of the first and second transistors to the third terminal of each of the first and second transistors, and a second current source coupled from the second terminal of each of the third and fourth transistors to the third terminal of each of the third and fourth transistors.

34. The method defined in claim 20 wherein the differential pair circuit further comprises:

first and second transistors each having first, second, and third terminals.

35. The method defined in claim 34 wherein the first and second transistors comprise bipolar junction transistors.

36. The method defined in claim 34 wherein the first and second transistors comprise metal oxide semiconductor field-effect transistors.

37. The method defined in claim 34 wherein the differential pair circuit further comprises:

a pair of second input terminals coupled to first and second outputs, respectively, of the current mirror circuit; and third and fourth transistors each having first, second, and third terminals, wherein the first terminal of the third transistor is coupled to the first terminal of the first transistor, the second terminal of the third transistor is coupled to the second terminal of the second transistor, the first terminal of the fourth transistor is coupled to the first terminal of the second transistor, the second terminal of the fourth transistor is coupled to the second terminal of the first transistor, the third terminals of each of the first and second transistors are coupled to the first output of the current mirror circuit, and the third terminals of each of the third and fourth transistors are coupled to the second output of the current mirror circuit.

38. The method defined in claim 37, wherein first, second, third, and fourth transistors are bipolar junction transistors.

39. The method defined in claim 37, wherein first, second, third, and fourth transistors are metal oxide semiconductor field-effect transistors.

40. A method for generating an output signal proportional to a first time varying voltage signal modulated by a second time varying signal, the method comprising:

converting the first time varying voltage signal to a first current signal;

folding the first current signal to produce a current folded signal;

providing negative feedback to the current folded signal to limit distortion in the current folded signal;

amplifying the current folded signal to produce an amplified current signal; and multiplying the amplified current signal by the second time varying signal to produce the output signal.

41. The method defined in claim 40, wherein converting the first time varying voltage signal to the first current signal further comprises converting the first time varying voltage signal to a first current signal using a transconductance amplifier with an output.

42. The method defined in claim 41, wherein providing negative feedback to the current folded signal further comprises limiting the peak-to-peak amplitude of a voltage swing at the output of the transconductance amplifier.

43. The method defined in claim 40, wherein amplifying the current folded signal further comprises amplifying the current folded signal using a current mirror circuit.

44. The method defined in claim 40, wherein multiplying the amplified current signal by the second time varying signal further comprises multiplying the amplified current signal by the second time varying signal using a differential pair circuit.

45. An improved signal modulator circuit that generates an output signal at an output node proportional to a first signal at a first signal node modulated by a second signal at a second signal node, the signal modulator having (1) a transconductance amplifier circuit coupled to the first signal node, and (2) a differential pair circuit coupled to the second signal node and the output node, the improvement comprising:

a current amplifier circuit comprising a current mirror circuit coupled to an output of the transconductance amplifier and the differential pair, the current mirror circuit comprising a feedback circuit coupled to the output of the transconductance amplifier.

46. The circuit of claim 45, wherein the current mirror circuit comprises first and second transistors.

47. The circuit of claim 46, wherein the first and second transistors are bipolar junction transistors, and the second transistor has a base-emitter junction area that is larger than a base-emitter junction area of the first transistor.

48. The circuit of claim 46, wherein the first and second transistors are metal oxide semiconductor field-effect transistors, and the second transistor has a gate width-to-length ratio that is larger than a gate width-to-length ratio of the first transistor.

49. The circuit defined in claim 46, wherein the current mirror circuit further comprises third and fourth transistors.

50. The circuit defined in claim 45 wherein the differential pair circuit further comprises two cross-coupled differential pairs, each differential pair comprising two transistors.

* * * * *

UNITED STATES PATENT AND TRADEMARK OFFICE
CERTIFICATE OF CORRECTION

PATENT NO.   : 6,300,845 B1  
DATED        : October 9, 2001  
INVENTOR(S)  : Min Z. Zou Page 1 of 1

It is certified that error appears in the above-identified patent and that said Letters Patent is hereby corrected as shown below:

Column 5,  
Line 14, change "$I_A^-$ Emitter" to -- $I_A^-$ Emitter --;

Column 6,  
Line 40, change "node 40" to -- node 42 --;

Column 7,  
Line 16, change "currents" to -- currents --;

Column 8,  
Line 20, change "-$I_{BMAX}$·I $V_{LO}$" to -- $I_{BMAX}$· $V_{LO}$ --;

Column 9,  
Line 39, change "$I_A$ Signals" to -- $I_A$. Signals --.

Signed and Sealed this

Twenty-third Day of April, 2002

Attest:

JAMES E. ROGAN  
*Attesting Officer*   *Director of the United States Patent and Trademark Office*